United States Patent
Harada

(10) Patent No.: US 9,558,815 B2
(45) Date of Patent: Jan. 31, 2017

(54) SEMICONDUCTOR STORAGE DEVICE

(71) Applicant: Kabushiki Kaisha Toshiba, Minato-ku (JP)

(72) Inventor: Yoshikazu Harada, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/986,899

(22) Filed: Jan. 4, 2016

(65) Prior Publication Data
US 2016/0196872 A1   Jul. 7, 2016

Related U.S. Application Data

(63) Continuation of application No. PCT/JP2013/068660, filed on Jul. 8, 2013.

(51) Int. Cl.
  *G11C 16/04* (2006.01)
  *G11C 11/56* (2006.01)
  *G11C 16/26* (2006.01)
  G11C 16/06 (2006.01)

(52) U.S. Cl.
  CPC ....... *G11C 11/5642* (2013.01); *G11C 16/0483* (2013.01); *G11C 16/26* (2013.01); *G11C 16/06* (2013.01)

(58) Field of Classification Search
  CPC .................................................. G11C 16/04
  USPC .............. 365/185.01–185.33, 189.011–225.7
  See application file for complete search history.

(56) References Cited

U.S. PATENT DOCUMENTS

| | | | |
|---|---|---|---|
| 7,400,535 B2 | 7/2008 | Li | |
| 7,495,963 B2 | 2/2009 | Edahiro et al. | |
| 7,573,744 B2 | 8/2009 | Edahiro et al. | |
| 2007/0008799 A1* | 1/2007 | Dono | G11C 5/063 365/222 |
| 2007/0255983 A1* | 11/2007 | Funaba | G11C 5/04 714/724 |

(Continued)

FOREIGN PATENT DOCUMENTS

| | | |
|---|---|---|
| JP | 2007-280505 A | 10/2007 |
| JP | 2008-84499 A | 4/2008 |

(Continued)

OTHER PUBLICATIONS

International Preliminary Report on Patentability and Written Opinion issued Jan. 21, 2016 in PCT/JP2013/068660 filed Jul. 8, 2013 (submitting English translation only).

(Continued)

*Primary Examiner* — Harry W Byrne
(74) *Attorney, Agent, or Firm* — Oblon, McClelland, Maier & Neustadt, L.L.P.

(57) ABSTRACT

A semiconductor storage device according to an embodiment includes a memory cell array including a plurality of memory cells. A plurality of word lines are connected to the memory cells. A plurality of bit lines are connected to one end of current paths of the memory cells. A sense amplifier part repeats a detection operation plural times when detecting data of memory cells connected to a word line WLn (n is an integer) among the word lines. A controller selects one of a plurality of detection results obtained by the detection operations, based on data of memory cells connected to a word line WLn−1 and data of memory cells connected to a word line WLn+1.

11 Claims, 12 Drawing Sheets

(56) References Cited

U.S. PATENT DOCUMENTS

| | | | |
|---|---|---|---|
| 2008/0298144 A1* | 12/2008 | Yumoto | G11C 29/24 365/200 |
| 2009/0115442 A1* | 5/2009 | Funaba | G11C 5/04 324/754.06 |
| 2010/0124109 A1 | 5/2010 | Honma et al. | |
| 2010/0135078 A1 | 6/2010 | Iwai et al. | |
| 2011/0051530 A1* | 3/2011 | Kushida | G11C 7/04 365/189.05 |
| 2012/0257453 A1 | 10/2012 | Shiino et al. | |
| 2013/0003454 A1 | 1/2013 | Edahiro et al. | |
| 2013/0077404 A1 | 3/2013 | Nawata et al. | |
| 2013/0148435 A1 | 6/2013 | Matsunaga | |

FOREIGN PATENT DOCUMENTS

| | | | |
|---|---|---|---|
| JP | 2009-545093 A | 12/2009 |
| JP | 2010-123210 A | 6/2010 |
| JP | 2010-134984 A | 6/2010 |
| JP | 2010-539630 A | 12/2010 |
| JP | 2012-221522 A | 11/2012 |
| JP | 2013-12267 A | 1/2013 |
| JP | 2013-69388 A | 4/2013 |

OTHER PUBLICATIONS

Office Action issued Apr. 27, 2015 in Taiwanese Patent Application No. 102129718 (with English language translation).

* cited by examiner

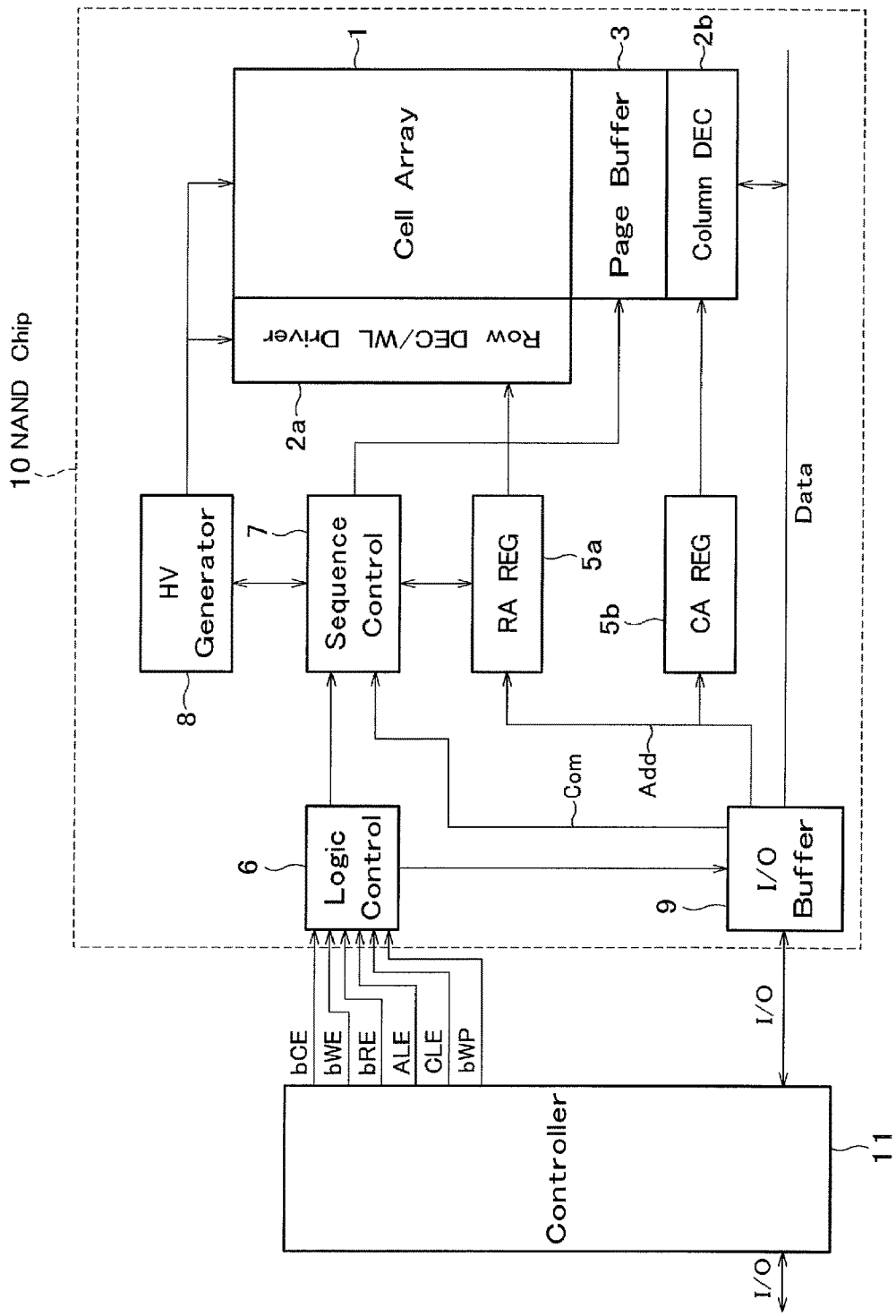
F I G. 1

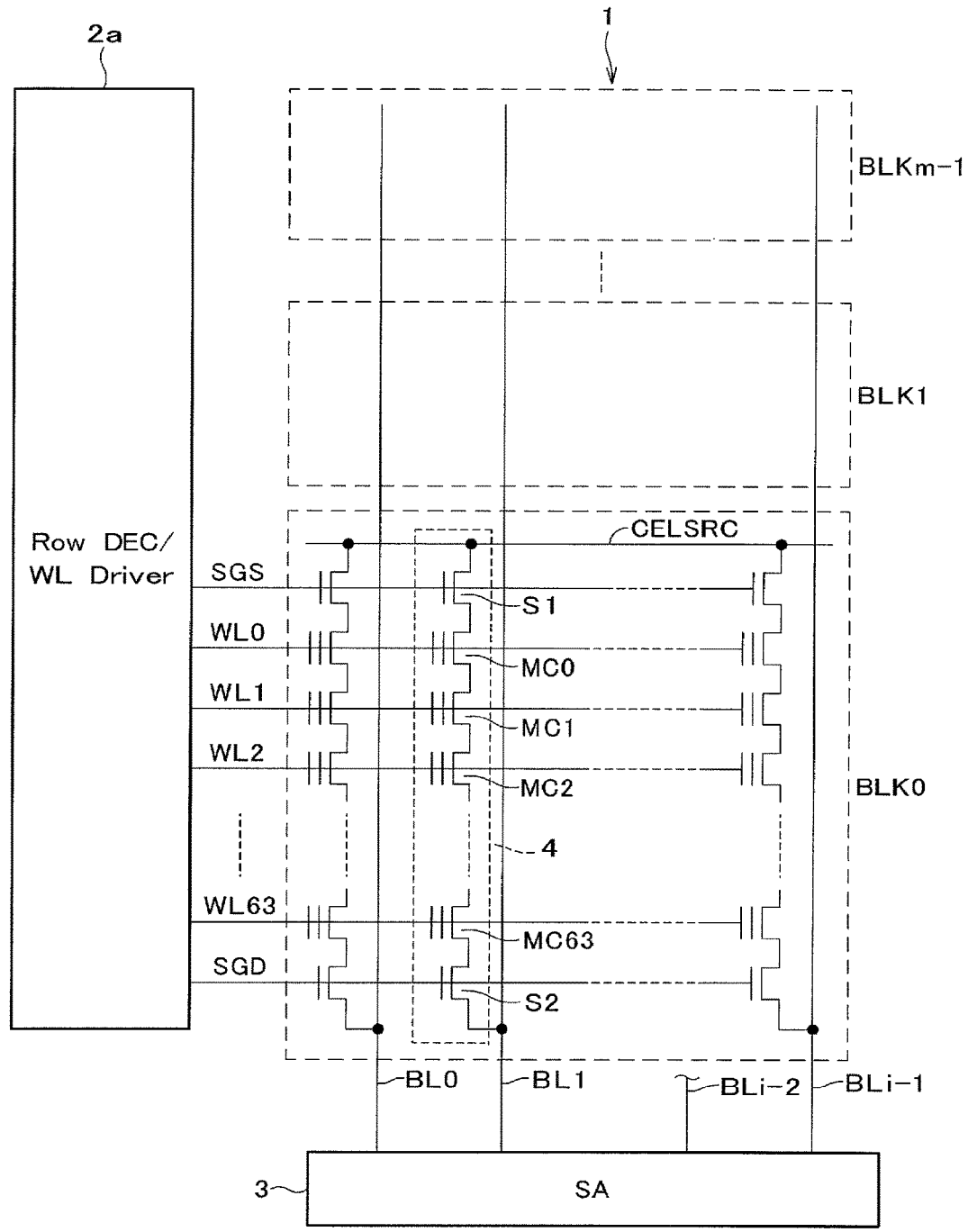
F I G. 2

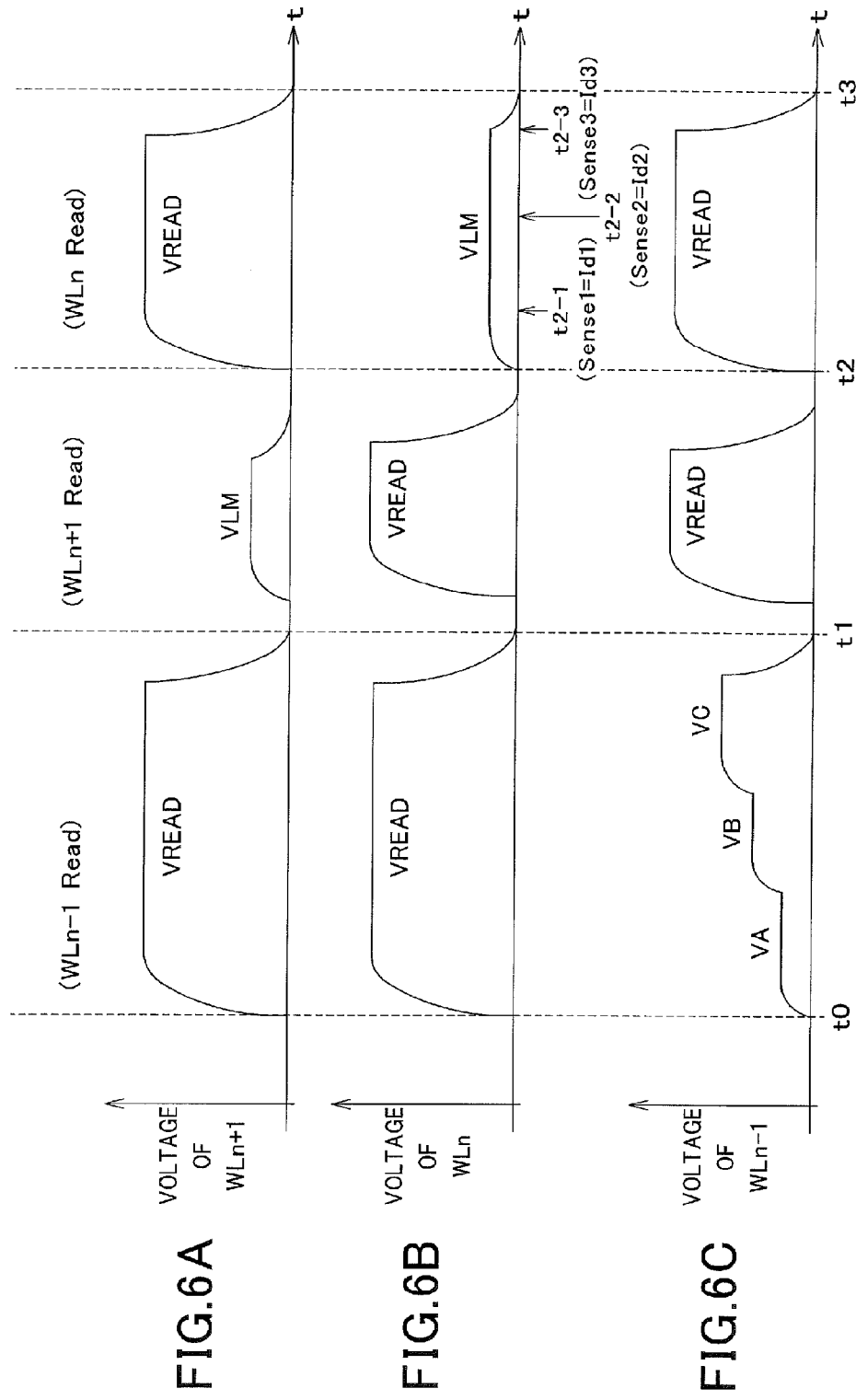

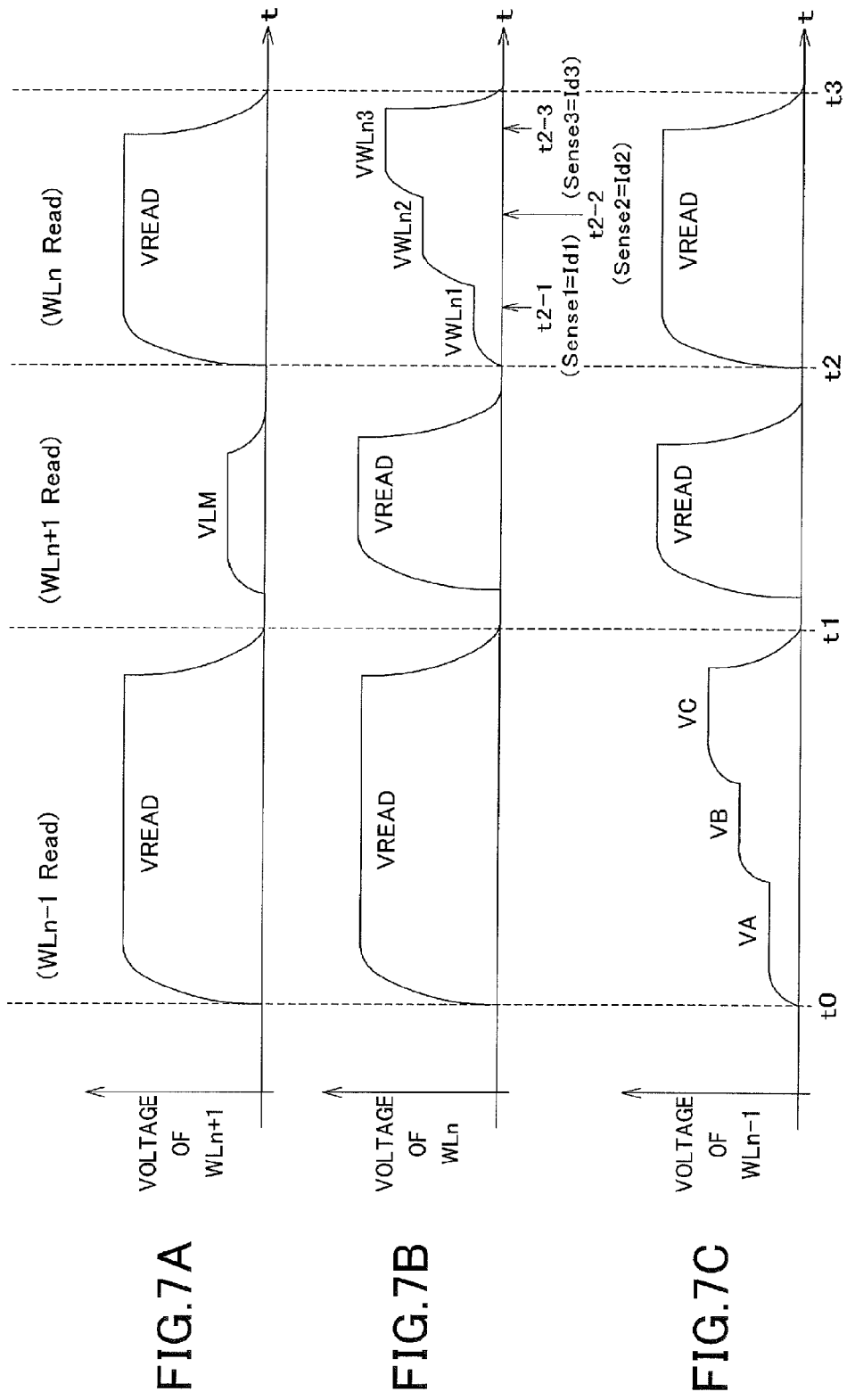

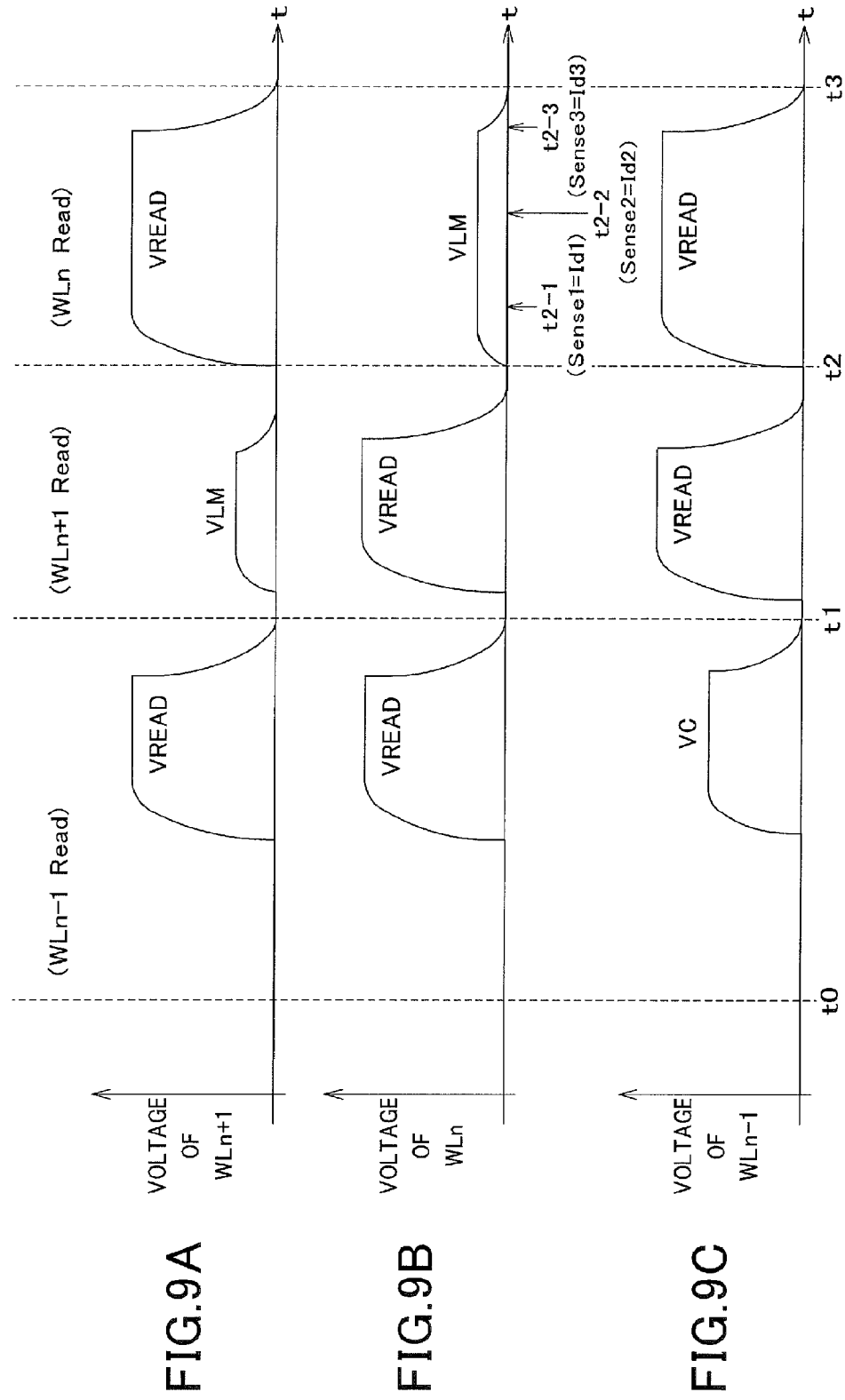

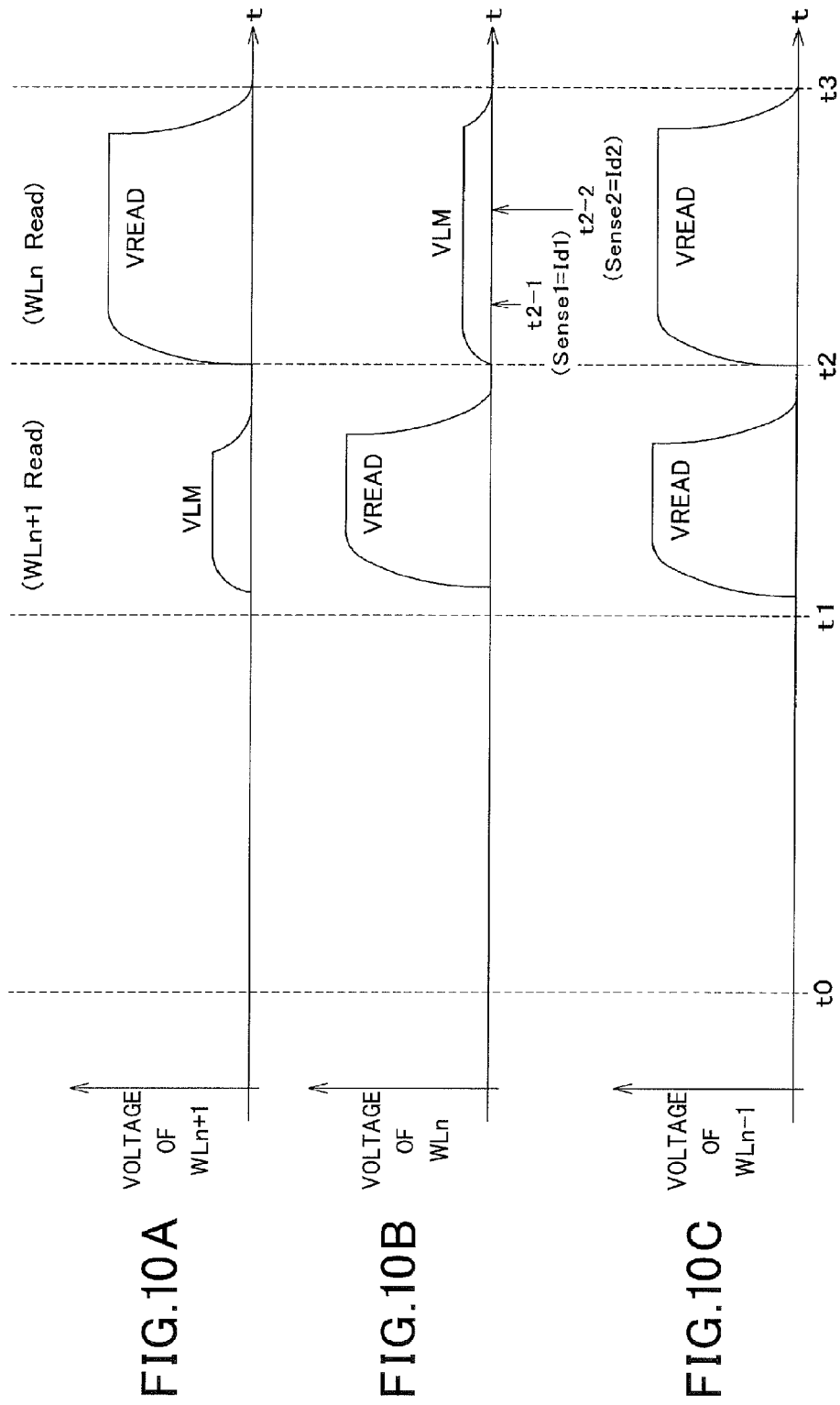

3 sense case

| Case NO. | MCn-1 | MCn+1 | MCn result |
|---|---|---|---|
| 1 | E/B | E | Sense1(t2-1) |
| 2 | E/B | LM | Sense2(t2-2) |
| 3 | A/C | E | Sense2(t2-2) |
| 4 | A/C | LM | Sense3(t2-3) |

FIG. 12A 2 sense case

| Case NO. | MCn-1 | MCn+1 | MCn result1 | MCn result2 |
|---|---|---|---|---|
| 11 | E/B | E | Sense1(t2-1) | Sense1(t2-1) |
| 12 | E/B | LM | Sense1(t2-1) | Sense2(t2-2) |
| 13 | A/C | E | Sense1(t2-1) | Sense2(t2-2) |
| 14 | A/C | LM | Sense2(t2-2) | Sense2(t2-2) |

SEMICONDUCTOR STORAGE DEVICE

CROSS REFERENCE TO RELATED APPLICATIONS

This application is based upon and claims the benefit of priority from the prior PCT International Patent Application No. PCT/JP2013/068660, filed on Jul. 8, 2013, the entire contents of which are incorporated herein by reference.

FIELD

The embodiments of the present invention relate to a semiconductor storage device.

BACKGROUND

Semiconductor storage devices such as a NAND flash memory are commonly known.

BRIEF DESCRIPTION OF THE DRAWINGS

FIG. 1 is a block diagram showing an example of a configuration of a NAND flash memory according to a first embodiment;

FIG. 2 shows an example of a specific configuration of the memory cell array 1;

FIGS. 6A to 6C show timing charts of an IDL operation of a memory according to the first embodiment;

FIGS. 7A to 7C show timing charts of an IDL operation of a memory according to a first modification of the first embodiment;

FIGS. 9A to 9C show timing charts of an IDL operation of a memory according to a second embodiment;

FIGS. 10A to 10C show timing charts of an IDL operation of a memory according to a third embodiment;

FIG. 12A is a table showing selection results selected from three detection results for the memory cell MCn; and FIG. 12B is a table showing selection results selected from two detection results for the memory cell MCn.

DETAILED DESCRIPTION

Figure 3:
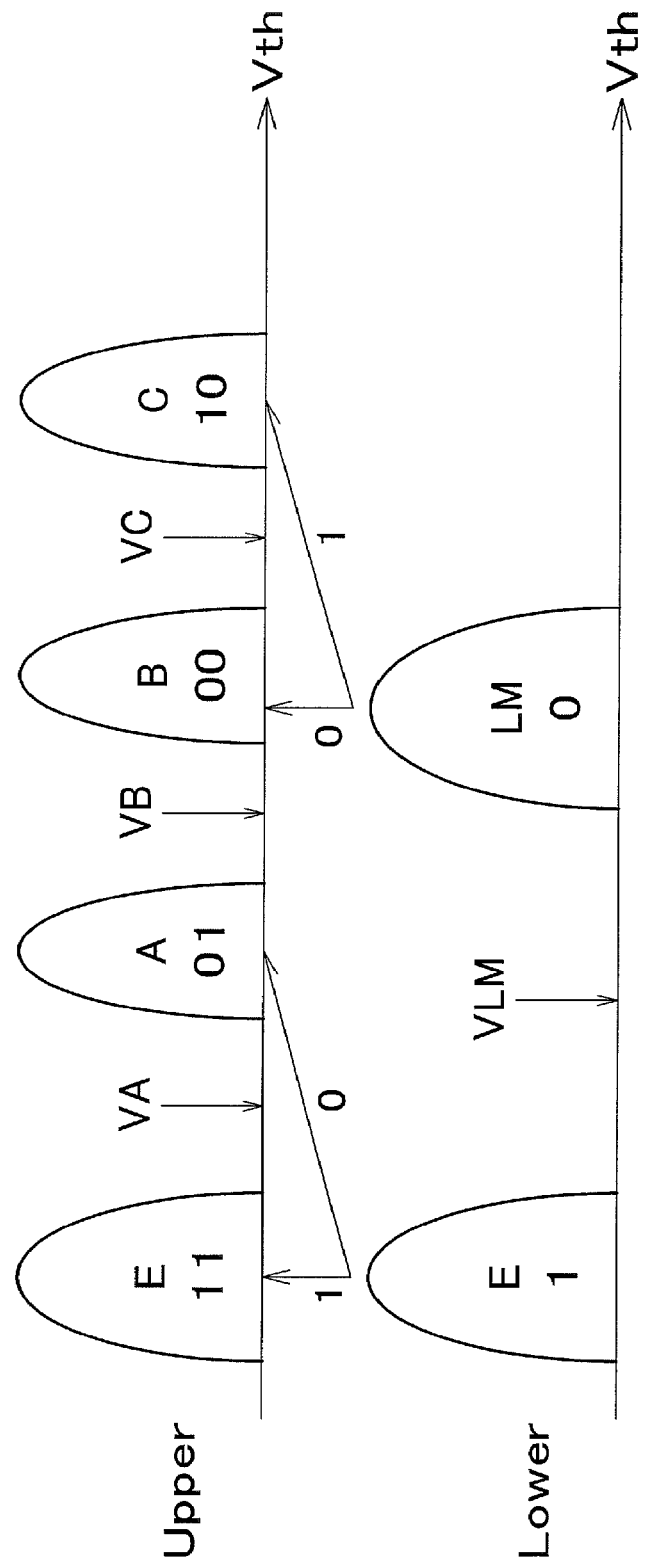
FIG. 3 shows threshold distributions of memory cells MC in a case where write of 2-bit data is performed.

In the explanations of embodiments, common parts are denoted by common reference characters in all drawings. However, it should be noted that the drawings are schematic and that relations between the thickness and the planar dimension, ratios of the thicknesses of layers, and the like differ from actual ones.

Therefore, specific thicknesses and dimensions are to be determined in consideration of the following explanations. It is needless to mention that parts differing in the relations or ratios of the dimensions among the drawings are included.

A semiconductor storage device according to an embodiment includes a memory cell array including a plurality of memory cells. A plurality of word lines are connected to the memory cells. A plurality of bit lines are connected to one end of current paths of the memory cells. A sense amplifier part repeats a detection operation plural times when detecting data of memory cells connected to a word line WLn (n is an integer) among the word lines. A controller selects one of a plurality of detection results obtained by the detection operations, based on data of memory cells connected to a word line WLn−1 and data of memory cells connected to a word line WLn+1.

First Embodiment

FIG. 1 is a block diagram showing an example of a configuration of a NAND flash memory according to a first embodiment. The NAND flash memory according to the first embodiment includes a NAND chip 10 and a controller 11 that controls the NAND chip 10. The NAND chip 10 and the controller 11 can be sealed with a resin in one package as a multi-chip package (MCP).

A memory cell array 1 constituting the NAND chip 10 is configured to have a plurality of memory cells MC arrayed two-dimensionally in a matrix. These memory cells MC include a charge accumulation layer. The memory cells MC are not limited to FG (Floating Gate) memory cells and may be MONOS (Metal-Oxide-Nitride-Oxide-Silicon) memory cells, for example. A row decoder/word line driver 2a, a column decoder 2b, a page buffer 3, and an internal-voltage generation circuit 8 constitute a data write/read circuit that performs write and read of data in units of pages to/from the memory cell array 1. The row decoder/word line driver 2a selectively drives word lines in the memory cell array 1. The page buffer 3 includes a sense amplifier circuit and a data retention circuit corresponding to one page and performs read and write of data in units of pages of the memory cell array 1.

Read data corresponding to one page in the page buffer 3 is selected column by column by the column decoder 2b and is output to an external I/O terminal via an I/O buffer 9. Write data supplied from the I/O terminal is selected by the column decoder 2b to be loaded into the page buffer 3. Write data corresponding to one page is loaded into the page buffer 3. A row address signal and a column address signal are input via the I/O buffer 9 and are transferred to the row decoder 2a and the column decoder 2b, respectively. A row address register 5a retains an erase block address in an erase operation and retains a page address in a write or read operation. A first column address to be used to load write data before start of a write operation or a first column address for a read operation is input to a column address register 5b. The column address register 5b retains the input column address until a write enable signal bWE or a read enable signal bRE is toggled on a predetermined condition.

A logic control circuit 6 controls input of a command or an address and input/output of data based on a control signal such as a chip enable signal bCE, a command enable signal CLE, an address-latch enable signal ALE, the write enable signal bWE, or the read enable signal bRE. The read operation or the write operation is performed according to a command. Upon reception of a command, a sequence control circuit 7 executes sequence control of read, write, or erase. The internal-voltage generation circuit 8 receives an external power supply voltage VCC and generates predetermined voltages required for various operations under control of the sequence control circuit 7. An internal power supply voltage VDC for a sense amplifier, explained later, is generated by the internal-voltage generation circuit 8.

The controller 11 executes control on write and read of data on a condition suitable for a present write state of the NAND chip 10. It is needless to mention that a part of the read control can be executed by the NAND chip 10.

FIG. 2 shows an example of a specific configuration of the memory cell array 1. In this example, 64 memory cells MC0 to MC63 series-connected and select gate transistors S1 and S2 connected on both ends of the memory cells MC0 to MC63, respectively, constitute a NAND cell unit (a NAND string) 4. A source of the select gate transistor S1 is connected to a common source line CELSRC and a drain of the select gate transistor S2 is connected to a bit line BL (BL0 to BLi−1). That is, the bit lines BL are connected to one end of current paths of the memory cells MC, respectively. Control gates of the memory cells MC0 to MC63 are connected to word lines WL (WL0 to WL63), respectively, and gates of the select gate transistors S1 and S2 are connected to select gate lines SGS and SGD, respectively.

A range of a plurality of memory cells MC along one word line WL is a page as a unit of batch data read and write. A range of a plurality of NAND cell units 4 arranged in the direction of the word lines WL constitutes a cell block BLK as a unit of batch data erase. In FIG. 2, a plurality of cell blocks BLK0 to BLKm−1 that share the bit lines BL are arrayed in the direction of the bit lines BL to constitute the memory cell array 1. The word lines WL and the select gate lines SGS and SGD are driven by the row decoder 2a. The bit lines BL are connected to a sense amplifier circuit SA of the page buffer 3 respectively. The sense amplifier circuit SA detects data of a memory cell MC selected by the bit line BL and the word line WL.

FIG. 3 shows threshold distributions of memory cells MC in a case where write of 2-bit data is performed. In the first embodiment, one memory cell MC stores therein 2-bit data. By block erase, threshold voltages Vt of all memory cells MC in a block become a lowest "E (Erase)" level. Thereafter, at the time of write of lower pages, write to raise the threshold voltage to an "LM" level is performed to memory cells MC having lower page data "0". The "E" level and the "LM" level change under an influence of adjacent memory cells to which write is thereafter performed and the threshold distribution width is widened. In the subsequent write of upper pages, the threshold distributions are further moved according to upper page data, so that four narrow threshold distributions "E", "A", "B", and "C" corresponding to data "11", "01", "00", and "10", respectively, are generated. In this case, the lowest erase E level is used as it is as the E level. The second lowest A level is generated by shifting from the E level. The B and C levels are generated by shifting from the LM level.

Figure 4:
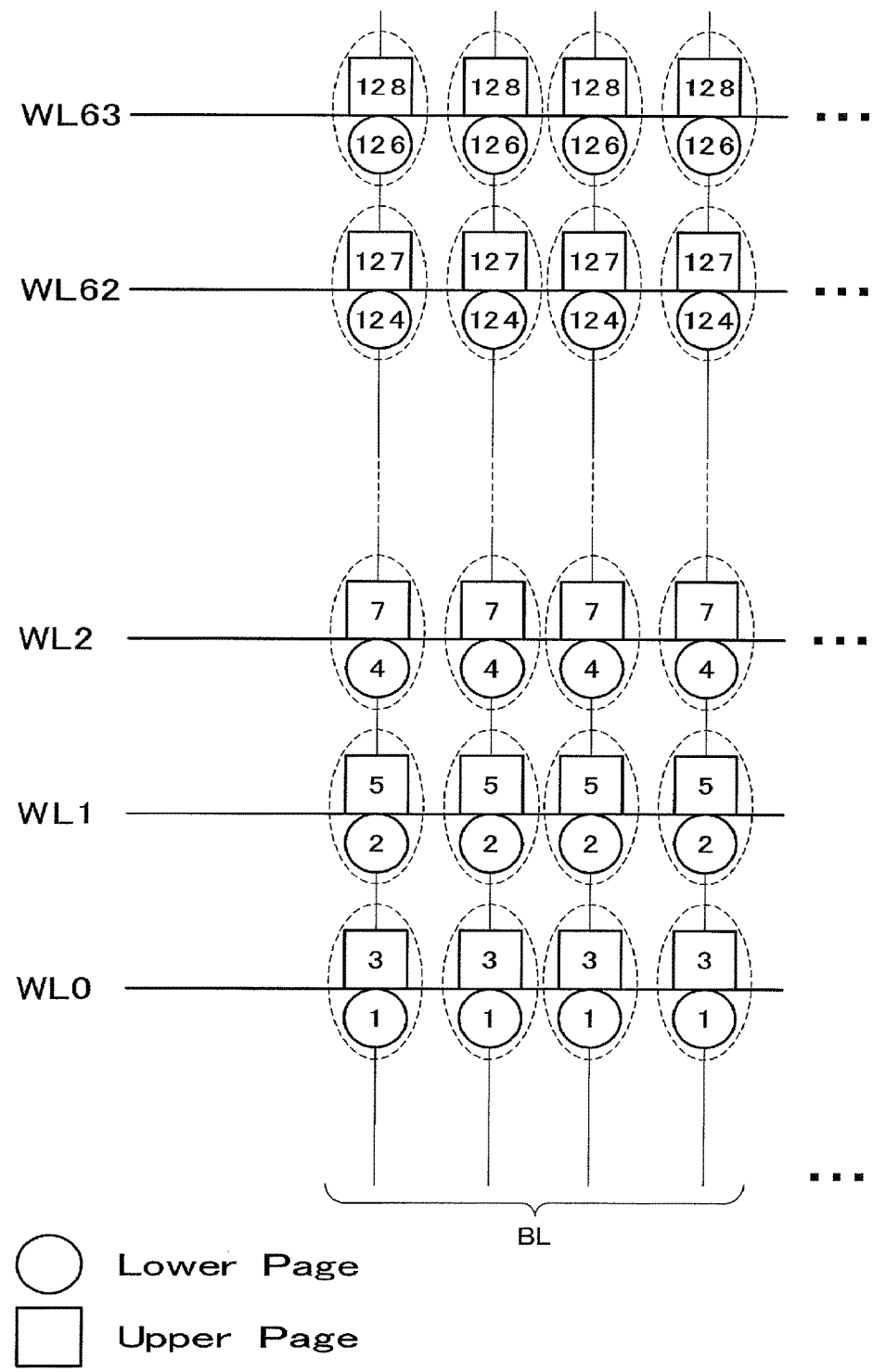
FIG. 4 shows a page write order in a memory block. A lower page represented by a "circle" and an upper page represented by a "rectangle" are shown as different pages.

FIG. 4 shows a page write order in a memory block. A lower page represented by a "circle" and an upper page represented by a "rectangle" are shown as different pages. Data is written alternately to lower pages and upper pages on word lines WL different from each other. Numbers described in the "circles" representing lower pages and the "rectangles" representing upper pages indicate the write order. The number of word lines WL and the number of bit lines BL are not particularly limited.

For example, after data is written to lower pages on a word line WL0, data is written to lower pages on a word line WL1. Next, data is written to upper pages on the word line WL0. Subsequently, data is written to lower pages on a word line WL2 and data is written to upper pages on the word line WL1. Thereafter, write of lower pages on a word line WLn (n is an integer equal to or larger than 3) and write of upper pages on a word line WLn−1 are repeated.

In this way, data is written alternately to lower pages and upper pages on word lines WL different from each other. Accordingly, write of upper pages of memory cells connected to the word line WLn is performed after write of lower pages of memory cells connected to a word line WLn+1 and upper pages of memory cells connected to a word line WLn−1, where the word lines WLn−1 and WLn+1 are adjacent to the word line WLn on the anterior and posterior sides, respectively. This can suppress widening of threshold distributions of the memory cells due to the adjacent interference effect to some extent.

In a case of a multi-level memory (MLC (Multi-Level Cell)), immediately before write of upper pages on a certain word line WL, lower pages on the word line WL are detected. This operation is called IDL (Internal Data Load). Data of upper pages can be written after the state (E or LM) of lower pages is referred to by the IDL. However, lower pages of the memory cells MC may have been affected by write of upper pages or lower pages of memory cells adjacent to the memory cells MC on the both sides.

For example, lower pages of memory cells connected to the word line WL1 shown in FIG. 4 is focused. Between write of the lower pages of the memory cells connected to the word line WL1 (a second operation) and write of the upper pages thereof (a fifth operation), write of the upper pages of the memory cells connected to the word line WL0 (a third operation) and write of the lower pages of the memory cells connected to the word line WL2 (a fourth operation) are performed. This means that, immediately before write of the upper pages of the memory cells connected to the word line WL1, the lower pages of the memory cells connected to the word line WL1 are affected by the write of the upper pages of the memory cells connected to the word line WL0 and the write of the lower pages of the memory cells connected to the word line WL2.

In this case, threshold distributions of the lower pages of the memory cells connected to the word line WL1 are widened. The lower pages include data of the E level and the LM level as shown in FIG. 3. Therefore, if the threshold distributions of the E level and the LM level are widened, the sense amplifier circuit SA cannot accurately detect the E level and the LM level by the IDL.

Figure 5A:
FIGS. 5A to 5D show adjacent interference effects affecting lower pages of memory cells MCn connected to a word line WLn.

FIGS. 5A to 5D show adjacent interference effects affecting lower pages of memory cells MCn connected to a word line WLn. Before write is performed, the memory cells MCn are in an erase state (E1) as shown in FIG. 5A. That is, data is not written yet to the lower pages of the memory cells MCn. At this stage, data is written to lower pages of memory cells MCn−1 connected to a word line WLn−1 adjacent to the word line WLn. Therefore, a threshold distribution of the memory cells MCn changes from the state E1 to a state E2 under an influence of the adjacent interference effect due to the write of the lower pages of the memory cells MCn−1. However, because data has not been written yet to the lower pages of the memory cells MCn at this stage, change of the threshold distribution of the memory cells MCn from the state E1 to the state E2 causes no problem.

Figure 5B:

Next, data is written to the lower pages of the memory cells. MCn as shown in FIG. 5B. Accordingly, the threshold distribution of the memory cells MCn is divided to have memory cells at the E2 level and memory cells at an LM1 level. At this stage, the lower pages (the E2 and LM1 levels) of the memory cells MCn are not affected by the adjacent interference effect.

Figure 5C:
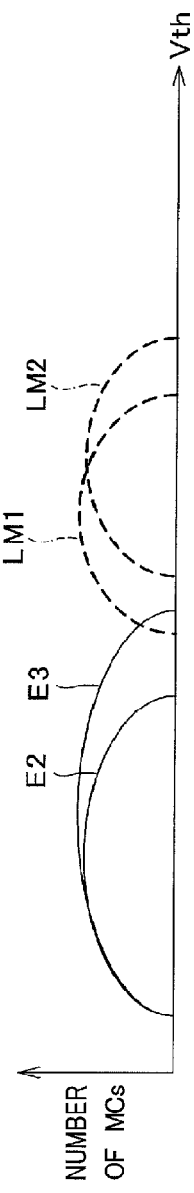

Subsequently, data is written to upper pages of the memory cells MCn−1 connected to the word line WLn−1. Write of the upper pages includes an operation of write from the E level to the E or A level and an operation of write from the LM level to the B or C level as explained with reference to FIG. 3. Among these write operations, the write from the E level to the E level and the write from the LM level to the B level hardly change the threshold voltages of the memory cells. On the other hand, the threshold voltages of the memory cells greatly change in the write from the E level to the A level and the write from the LM level to the C level. Therefore, the memory cells MCn are affected by the adjacent interference effects from ones of the adjacent memory cells MCn−1 to which write from the E level to the A level is performed and ones thereof to which write from the LM level to the C level is performed. Accordingly, the threshold distributions of the lower pages of the memory cells MCn change from the E2 level to an E3 level and from the LM1 level to an LM2 level as shown in FIG. 5C.

Figure 5D:
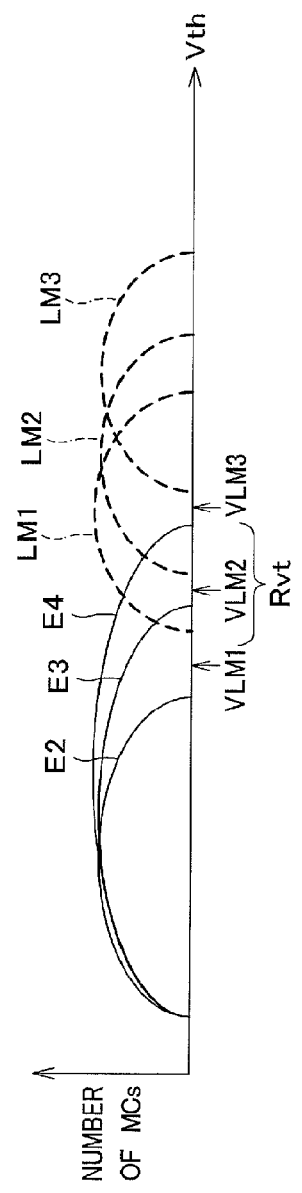

Next, data is written to lower pages of memory cells MCn+1 connected to the word line WLn+1. Write to lower pages is an operation of write from the E level to the E or LM level. In these write operations, the write from the E level to the E level hardly changes the threshold voltages of the memory cells. On the other hand, the write from the E level to the LM level greatly changes the threshold voltages of the memory cells. Therefore, the memory cells MCn are affected by the adjacent interference effects of ones of the adjacent memory cells MCn+1 to which write from the E level to the LM level is performed. This changes the threshold distributions of the lower pages of the memory cells MCn from the E3 level to an E4 level and from the LM2 level to an LM3 level as shown in FIG. 5D. In this way, when the memory cells MCn are affected by the adjacent interference effects of the adjacent memory cells MCn−1 and MCn+1, the threshold distributions of the lower pages of the memory cells MCn adversely widen as shown in FIG. 5D.

Subsequently, the IDL is performed to the memory cells MCn. At this stage, as shown in FIG. 5D, the threshold distributions of the memory cells MCn have widened greatly. Memory cells MC having threshold voltages in a region Rvt may become memory cells having a threshold voltage of the E level or memory cells having a threshold voltage of the LM level according to the degree of the adjacent interference effects of adjacent memory cells.

There are cases where the sense amplifier circuit SA cannot accurately detect lower data even when the IDL is performed in this state where the threshold distributions of the lower data are widened. Correction using an ECC (Error Correcting Code) is not performed for an error in lower data in the IDL unlike an error in a general data read operation. Accordingly, an error in lower data in the IDL may lead to a hard bit error, which makes data correction difficult. In this case, a read error occurs.

It is known that shift of lower data of the memory cells MCn may be caused also by write of upper pages of the memory cells MCn−1 (write from the E level to the A level and write from the LM level to the C level) and write of lower pages of the memory cells MCn+1 (write from the E level to the LM level). Therefore, at the time of the IDL of the memory cells MCn, detected data of the lower pages on the word line WLn can be corrected by detecting data of either the memory cells MCn−1 or the memory cells MCn+1, or both thereof and using the detected data of the memory cells MCn−1 and/or the memory cells MCn+1.

For example, by setting the voltage of the word line WLn to VLM1 in the IDL, the sense amplifier circuit SA can distinguish memory cells at the E2 level from memory cells at the LM1 to LM3 levels. By setting the voltage of the word line WLn to VLM2, the sense amplifier circuit SA can distinguish memory cells at the E3 level from the memory cells at the LM2 and LM3 levels. Furthermore, by setting the voltage of the word line WLn to VLM3, the sense amplifier circuit SA can distinguish memory cells at the E4 level from the memory cells at the LM3 level.

Accordingly, in the memory according to the first embodiment, when detecting data of the memory cells MCn connected to the word line WLn in the IDL of a write operation, the sense amplifier circuit SA repeats a detection operation plural times and latches plural detection results. The sequence control circuit 7 (see FIG. 1) serving as a controller selects one of the detection results according to data of the memory cells MCn−1 and MCn+1 connected to the word lines WLn−1 and WLn+1 adjacent to the word line WLn on the both sides, respectively.

The data detection operation for the memory cells MCn in the IDL is explained next in more detail with reference to FIGS. 6A to 6C.

FIGS. 6A to 6C show timing charts of an IDL operation of a memory according to the first embodiment. FIGS. 6A to 6C show the timing charts of the IDL operation performed immediately before data is written to the upper page on the word line WLn.

(Data Detection for Memory Cells MCn−1 Connected to Word Line WLn−1)

In a period between times t0 and t1, data of the memory cells MCn−1 connected to the word line WLn−1 is detected. Immediately before data is written to the upper pages of the memory cells MCn, write of data to the memory cells MCn−1 is finished up to the upper pages. Therefore, the threshold voltages of the memory cells MCn−1 may have any one of the E, A, B, and C levels. To distinguish the E, A, B, and C levels from each other, detection of data of the memory cells MCn−1 is performed while changing the voltage level of the word line WLn−1 to VA, VB, or VC. As shown in FIG. 3, VA is a voltage level between the E level and the A level, VB is a voltage level between the A level and the B level, and VC is a voltage level between the B level and the C level.

For example, when the voltage of the word line WLn−1 is VA, the memory cells MCn−1 at the E level come into an ON state while the memory cells MCn−1 at the A, B, and C levels other than the E level are kept in an OFF state. Therefore, among the memory cells MCn−1, the memory cells at the E level are distinguished from the memory cells at the A, B, and C levels when the voltage of the word line WLn−1 is VA. Similarly, among the memory cells MCn−1 at the A, B, and C levels, the memory cells at the A level are distinguished from the memory cells at the B and C levels when the voltage of the word line WLn−1 is VB. Furthermore, among the memory cells MCn−1 at the B and C levels, the memory cells at the B level are distinguished from the memory cells at the C level when the voltage of the word line WLn−1 is VC.

In this way, the level of the threshold voltage of each of the memory cells MCn−1 among the E, A, B, and C levels can be detected. That is, the sense amplifier circuit SA can detect 2-bit data of each of the memory cells MCn−1. Data of the memory cells MCn−1 is held (latched) by the sense amplifier circuit SA or the page buffer PB.

As described above, when the adjacent memory cells MCn−1 are at the A or C level and when the adjacent memory cells MCn+1 are at the LM level, the memory cells MCn are affected by the adjacent interference effect. Therefore, when whether the adjacent memory cells MCn−1 and MCn+1 have the A or C level or have the E or B level can be known, whether the memory cells MCn are affected by the adjacent interference effect can be known. Accordingly, to reduce the adjacent interference effect, the sequence control circuit 7 can compress data into 1-bit data indicating whether the memory cells MC have the A or C level or have the E or B level. This enables the volume of data held by the sense amplifier circuit SA or the page buffer PB to be reduced.

Furthermore, other word lines WL0 to WLn−2 and WLn to WL63 are not selected at that time and thus are kept at a high level voltage VREAD. This enables the memory cells MCn−1 to connect between the bit lines BL and the cell source line CELSRC with a low resistance.

(Data Detection for Memory Cells MCn+1 Connected to Word Line WLn+1)

In a period between the time t1 and a time t2, data of the memory cells MCn+1 connected to the word line WLn+1 is detected. Immediately before data is written to the upper pages of the memory cells MCn, write of data to the memory cells MCn+1 is finished up to the lower pages and no data is written yet to the upper pages of the memory cells MCn+1. Therefore, the threshold voltages of the memory cells MCn+1 can have either the E level or the LM level. To distinguish the E and LM threshold levels from each other, detection of data of the memory cells MCn+1 is performed by setting the voltage level of the word line WLn+1 to VLM. As shown in FIG. 3, VLM is a voltage level between the E level and the LM level and is a read voltage between the E level and the LM level. VLM1 to VLM3 in FIG. 5 are examples of VLM.

For example, when the voltage of the word line WLn+1 is VLM, the memory cells MCn+1 at the E level come into an ON state while the memory cells MCn+1 at the LM level are kept in an OFF state. Therefore, among the memory cells MCn+1, memory cells at the E level and memory cells at the LM level are distinguished from each other when the voltage of the word line WLn+1 is VLM.

In this way, whether the respective threshold voltages of the memory cells MCn+1 are the E level or the LM level is detected. That is, the sense amplifier circuit SA can detect data of the respective lower pages of the memory cells MCn+1. The data of the memory cells MCn+1 is also held (latched) by the sense amplifier circuit SA or the page buffer PB.

At this time, other word lines WL0 to WLn and WLn+2 to WL63 are not selected and thus are kept at the high level voltage VREAD. Accordingly, the memory cells MCn+1 are connected between the bit lines BL and the cell source line CELSRC with a low resistance.

(Data Detection (IDL) for Memory Cells MCn Connected to Word Line WLn)

In a period between the time t2 and a time t3, data of the memory cells MCn connected to the word line WLn is detected. Because this is immediately before data is written to the upper pages of the memory cells MCn, write of data to the memory cells MCn is finished up to the lower pages. The threshold voltages of the memory cells MCn can have either the E level or the LM level.

However, as described above, the lower pages of the memory cells MCn are affected by the adjacent interference effects of write to the upper pages of the memory cells MCn−1 (write from the E level to the A level (hereinafter, also "WRITE(E-A)") and write from the LM level to the C level (hereinafter, also "WRITE(LM-C)"), and write to the lower pages of the memory cells MCn+1 (write from the E level to the LM level (hereinafter, also "WRITE(E-LM)"))). Therefore, it is inferred that the threshold distributions of the lower pages of the memory cells MCn are widened as shown in FIG. 5D.

The memory according to the first embodiment performs the detection operation plural times to detect lower data of the memory cells MCn. At that time, the voltage of the word line WLn is kept at a constant voltage VLM. For example, at a time t2-1, the sense amplifier circuit SA detects data of the memory cells MCn (first detection). Next, at a time t2-2, the sense amplifier circuit SA detects the data of the memory cells MCn again (second detection). Next, at a time t2-3, the sense amplifier circuit SA detects the data of the memory cells MCn once again (third detection). Results of the first to third detection are held in the sense amplifier circuit SA or the page buffer PB.

In the NAND flash memory, the sense amplifier circuit SA detects data of the memory cells MC by causing a current (charges) to flow from a sense node to the memory cells MC via the bit lines BL. The memory cells MCn allow constant cell currents according to logic of data and the constant voltage VLM of the word line WLn to flow through, respectively. Therefore, the sense amplifier circuit SA can discriminate the logic of data of the memory cells MC by detecting changes in the voltage of the sense node.

Detection of the data of the memory cells MCn at different timings (t2-1 to t2-3) as in the first embodiment causes the voltage of the sense node to be lower at the time t2-2 of the second detection than at the time t2-1 of the first detection and lower at the time t2-3 of the third detection than at the time t2-2 of the second detection. For example, charges Id1 are discharged from the sense node in a period between the times t2 and t2-1. Charges Id2 (>Id1) are discharged from the sense node in a period between the times t2 and t2-2. In a period between the times t2 and t2-3, charges Id3 (>Id2) are discharged from the sense node. Therefore, the voltage of the sense node differs at the respective times of the first to third detection. This is substantially equivalent to detecting the data of the memory cells MCn by changing the voltage of the word line WLn. For example, the first detection can correspond to the detection using VLM1, the second detection can correspond to the detection using VLM2, and the third detection can correspond to the detection using VLM3. That is, in the first embodiment, the IDL considering the adjacent interference effects is performed by changing the data detection timing instead of changing the set voltage of the word line WLn.

As described above, the adjacent interference effects affecting the lower pages of the memory cells MCn are caused by write to the upper pages of the memory cells MCn−1 (WRITE(E-A) and WRITE(LM-C)), and write to the lower pages of the memory cells MCn+1 (WRITE(E-LM)). These adjacent interference effects can be predicted to some extent and the memory cells at the E level can be distinguished from the memory cells at the LM level in consideration of the adjacent interference effects by changing the set voltage of the word line WLn to VLM1 to VLM3 as explained with reference to FIG. 5D. Similarly, by changing the detection timing (t2-1 to t2-3) in the sense amplifier circuit SA to correspond to the set voltages VLM1 to VLM3, the memory cells at the E level can be distinguished from the memory cells at the LM level in consideration of the adjacent interference effects.

The sequence control circuit 7 selects one of the results of the first to third detection held in the sense amplifier circuit SA or the page buffer PB according to data of the adjacent memory cells MCn−1 and MCn+1.

For example, in a case where the memory cell MCn−1 has data at the A (or C) level stored therein and the memory cell MCn+1 has data at the LM level stored therein in a certain bit line BL (column), it can be determined that the memory cell MCn is affected by the adjacent interference effects from both the memory cells MCn−1 and MCn+1 and belongs to the threshold distribution E4 or LM3 in FIG. 5D. Therefore, the sequence control circuit 7 selects and adopts the result of the first detection corresponding to VLM3.

For example, in a case where the memory cell MCn−1 has data at the A (or C) level stored therein and the memory cell MCn+1 has data at the E level stored therein in another bit line BL (column), it can be determined that the memory cell MCn is affected by the adjacent interference effect from the memory cell MCn−1 and belongs to the threshold distribution E3 or LM2 in FIG. 5D. Therefore, the sequence control circuit 7 selects and adopts the result of the second detection corresponding to VLM2.

For example, in a case where the memory cell MCn−1 has data at the E (or B) level stored therein and the memory cell MCn+1 has data at the LM level stored therein in still another bit line BL (column), it can be determined that the memory cell MCn is affected by the adjacent interference effect from the memory cell MCn+1 and belongs to the threshold distribution E3 or LM2 in FIG. 5D. Therefore, the sequence control circuit 7 selects and adopts the result of the second detection corresponding to VLM2.

For example, in a case where the memory cell MCn−1 has data at the E (or B) level stored therein and the memory cell MCn+1 has data at the E level stored therein in still another bit line BL (column), it can be determined that the memory cell MCn is not affected by the adjacent interference effects from the memory cells MCn−1 and MCn+1 and belongs to the threshold distribution E2 or LM1 in FIG. 5D. Therefore, the sequence control circuit 7 selects and adopts the result of the third detection corresponding to VLM1.

In the NAND flash memory, a multi-level technology is commonly used to store data of two or more bits in one memory cell to lower the bit cost. Furthermore, memory cells are further downscaled to reduce the chip size. Under such circumstances, threshold distributions widened due to interference between adjacent cells (the adjacent interference effect) cannot be ignored. The adjacent interference effect is a phenomenon in which the threshold voltage of a memory cell to which data has been already written is shifted due to data write operations for adjacent memory cells. The adjacent interference effect may enlarge the threshold voltage distribution of the memory cell and lower the reliability of data detected by a sense amplifier.

In contrast, according to the first embodiment, at the time of the IDL, the sense amplifier circuit SA detects data of memory cells connected to the word lines WLn−1 and WLn+1 adjacent to the word line WLn as the target of the IDL on the both sides, and further detects data of the memory cells MCn connected to the word line WLn repeatedly plural times at different timings. The sequence control circuit 7 selects one of results of the detection for the memory cells MCn according to the data of the adjacent memory cells MCn−1 and MCn+1. The sequence control circuit 7 performs this selection operation with respect to each column. In this way, the sequence control circuit 7 can select and adopt one of the detection results in consideration of the adjacent interference effects from the adjacent memory cells MCn−1 and MCn+1. Therefore, the memory according to the first embodiment can accurately detect data in the IDL.

In the first embodiment, the sense amplifier circuit SA detects all data of the adjacent memory cells MCn−1 and the adjacent memory cells MCn+1. Therefore, the sequence control circuit 7 can select one of the detection results of the memory cells MCn in consideration of the adjacent interference effects affecting the lower pages of the memory cells MCn (the adjacent interference effects due to WRITE(E-A), WRITE(LM-C), and WRITE(E-LM)).

In the first embodiment, the sense amplifier circuit SA detects data of the memory cells MCn three times at different timings. However, the sense amplifier circuit SA can detect the data of the memory cells MCn twice at different timings. In this case, the memory can select and adopt one of results of the detection in consideration of the adjacent interference effect from either the adjacent memory cells MCn−1 or MCn+1, or both thereof.

For example, FIG. 12A is a table showing selection results selected from three detection results for the memory cell MCn. A case 1 shown in FIG. 12A is a case where the adjacent memory cell MCn−1 is at the E or B level and the adjacent memory cell MCn+1 is at the E level. In this case, the memory cell MCn is not affected by the adjacent interference effects from the adjacent memory cells MCn−1 and MCn+1. Therefore, the memory selects Sense1 detected at the time t2-1. A case 2 is a case where the adjacent memory cell MCn−1 is at the E or B level and the adjacent memory cell MCn+1 is at the LM level. In this case, the memory cell MCn is affected by the adjacent interference effect from the adjacent memory cell MCn+1 although not affected by the adjacent interference effect from the adjacent memory cell MCn−1. Therefore, the memory selects Sense2 detected at the time t2-2. A case 3 is a case where the adjacent memory cell MCn−1 is at the A or C level and the adjacent memory cell MCn+1 is at the E level. In this case, the memory cell MCn is affected by the adjacent interference effect from the adjacent memory cell MCn−1 although not affected by the adjacent interference effect from the adjacent memory cell MCn+1. Therefore, the memory selects Sense2 detected at the time t2-2. A case 4 is a case where the adjacent memory cell MCn−1 is at the A or C level and the adjacent memory cell MCn+1 is at the LM level. In this case, the memory cell MCn is affected by the adjacent interference effects from both the adjacent memory cells MCn−1 and MCn+1. Therefore, the memory selects Sense3 detected at the time t2-3.

FIG. 12B is a table showing selection results selected from two detection results for the memory cell MCn. When there are two detection results (Sense1 and Sense2, for example), the memory selects either Sense1 or Sense2 according to the adjacent interference effect.

In a case 11 shown in FIG. 12B, the memory cell MCn is not affected by the adjacent interference effects from the adjacent memory cells MCn−1 and MCn+1 similarly to the case 1. Therefore, the memory selects Sense1 detected at the time t2-1. In a case 14, the memory cell MCn is affected by the adjacent interference effects from both the adjacent memory cells MCn−1 and MCn+1 similarly to the case 4. Therefore, the memory selects Sense2 detected at the time t2-2.

In a case 12, the memory cell MCn is affected by the adjacent interference effect from the adjacent memory cell MCn+1 although not affected by the adjacent interference effect from the adjacent memory cell MCn−1 similarly to the case 2. In a case 13, the memory cell MCn is affected by the adjacent interference effect from the adjacent memory cell MCn−1 although not affected by the adjacent interference effect from the adjacent memory cell MCn+1 similarly to the case 3. Therefore, in the cases 12 and 13, the memory cell MCn is affected by the adjacent interference effect only once. Accordingly, in these cases, Sense1 can be selected without considering the adjacent interference effect as in a selection result Result1. Alternatively, Sense2 can be selected considering the adjacent interference effect as in a selection result Result2.

(First Modification)

FIGS. 7A to 7C show timing charts of an IDL operation of a memory according to a first modification of the first embodiment. According to the first modification, the voltage of the word line WLn is stepped up to VWLn1, VWLn2, and VWLn3 at the detection timings t2-1 to t2-3, respectively. Other operations of the first modification can be identical to corresponding operations of the first embodiment.

In the first modification, during the IDL, the sense amplifier circuit SA detects data of memory cells connected to the word lines WLn−1 and WLn+1 adjacent to the word line WLn as the target of the IDL on the both sides, and further detects data of the memory cells MCn repeatedly plural times while changing the voltage of the word line WLn. As long as plural detection operations at the detection timings t2-1 to t2-3 correspond to detection obtained when the voltage of the word line WLn is set to VWLn1 to VWLn3, respectively, the voltage of the word line WLn can be changed to correspond to the detection timings t2-1 to t2-3 as in the first modification.

(Second Modification)

Figures 8A, 8B, 8C:
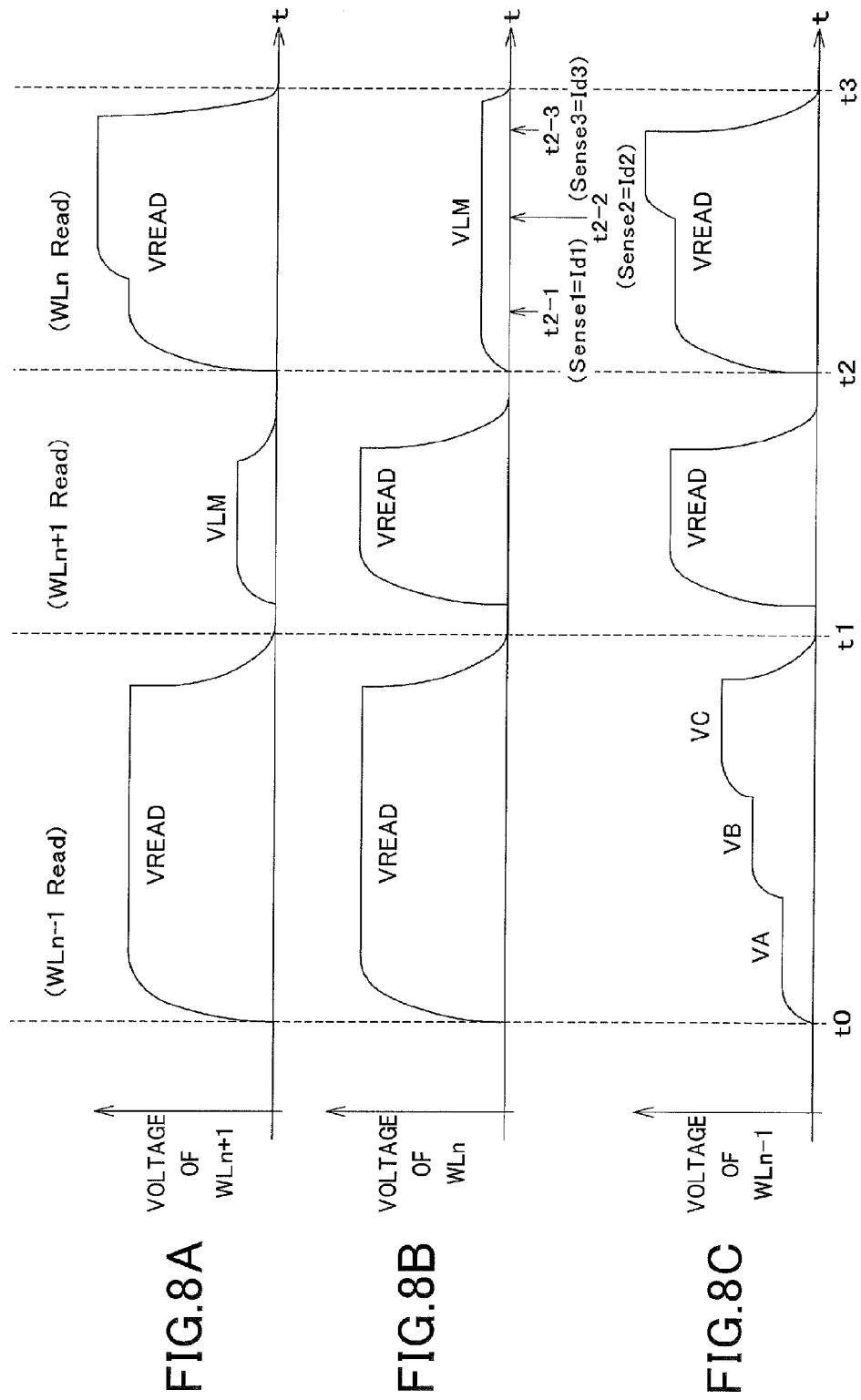
FIGS. 8A to 8C show timing charts of an IDL operation of a memory according to a second modification of the first embodiment.

FIGS. 8A to 8C show timing charts of an IDL operation of a memory according to a second modification of the first embodiment. In a case where the voltage of the word line WLn is to be changed, the voltages of the adjacent word lines WLn+1 and WLn−1 can be changed as in a period between times t2 and t3 shown in FIGS. 8A to 8C. Use of the adjacent interference effect causes the voltage of the word line WLn to change with changes in the voltages of the adjacent word lines WLn+1 and WLn−1. The voltage of the word line WLn can be stepped up to VWLn1, VWLn2, and VWLn3 similarly to the first modification also by thus changing the voltages of the adjacent word lines WLn+1 and WLn−1 to correspond to detection timings t2-1 to t2-3. Because VLM is applied to the word line WLn between the times t2 and t3, for example, the voltage of the word line WLn is shown to be constant at VLM between the times t2 and t3 in FIG. 8. However, the voltage of the word line WLn actually changes in an identical manner to the word line WLn between the times t2 and t3 in FIG. 7 due to the adjacent interference effects of the voltages of the adjacent word lines WLn+1 and WLn−1.

It goes without saying that the operation of the adjacent word line WLn+1 and the operation of the adjacent word line WLn−1 can be exchanged to change the voltage of the word line WLn.

Second Embodiment

FIGS. 9A to 9C show timing charts of an IDL operation of a memory according to a second embodiment. In the second embodiment, detection of data of the memory cells MCn−1 between times t0 and t1 is performed by setting the voltage level of the word line WLn−1 to VC. Data detection at a time when the voltage level of the word line WLn−1 is VA and VB is not performed. Therefore, in the second embodiment, among the memory cells MCn−1, memory cells at the E, A, and B levels are distinguished from memory cells at the C level. That is, among the memory cells MCn−1, the memory cells at the E, A, and B levels are not distinguished from each other. Other operations of the second embodiment can be identical to corresponding operations of the first embodiment.

As described above, because the memory cells at the E, A, and B levels among the memory cells MCn−1 are not distinguished from each other, the adjacent interference effect caused by WRITE(E-A) to the upper pages of the memory cells MCn−1 among the adjacent interference effects affecting the lower pages of the memory cells MCn (the adjacent interference effects caused by WRITE(E-A), WRITE(LM-C), and WRITE(E-LM)) is not considered. That is, the sequence control circuit 7 selects one of detection results of the memory cells MCn without considering the adjacent interference effect caused by WRITE(E-A).

However, the sequence control circuit 7 can select one of the detection results for the memory cells MCn considering the adjacent interference effects caused by WRITE(LM-C) and WRITE(E-LM) other than WRITE(E-A). Therefore, the memory according to the second embodiment can accurately detect data in the IDL to some extent even when the threshold distributions of the memory cells MCn overlap due to the adjacent interference effects.

Third Embodiment

FIGS. 10A to 10C show timing charts of an IDL operation of a memory according to a third embodiment. In the third embodiment, data detection of the memory cells MCn−1 is not performed between times t0 and t1. That is, data of the memory cells MCn−1 is not distinguished.

Because the data of the memory cells MCn−1 is not distinguished, the adjacent interference effects caused by WRITE(E-A) and WRITE(LM-C) to the upper pages of the memory cells MCn−1 among the adjacent interference effects affecting the lower pages of the memory cells MCn (the adjacent interference effects caused by WRITE(E-A), WRITE(LM-C), and WRITE(E-LM)) are not considered. That is, the sequence control circuit 7 selects one of detection results of the memory cells MCn without considering the adjacent interference effects caused by WRITE(E-A) and WRITE(LM-C).

In the third embodiment, because the adjacent interference effects caused by write to the upper pages of the memory cells MCn−1 are not considered as described above, two detection operations at times t2-1 and t2-2 suffice as the detection operation between times t2 and t3. By performing two detection operations, a read time in a verify operation can be shortened. Other operations of the third embodiment can be basically identical to corresponding operations of the first embodiment.

In the third embodiment, the sequence control circuit 7 can select one of the detection results for the memory cells MCn considering the adjacent interference effect caused by WRITE(E-LM) to the memory cells MCn+1. Therefore, the memory according to the third embodiment can accurately detect data in the IDL to some extent even when the threshold distributions of the memory cells MCn overlap due to the adjacent interference effects.

Fourth Embodiment

Figures 11A, 11B, 11C:
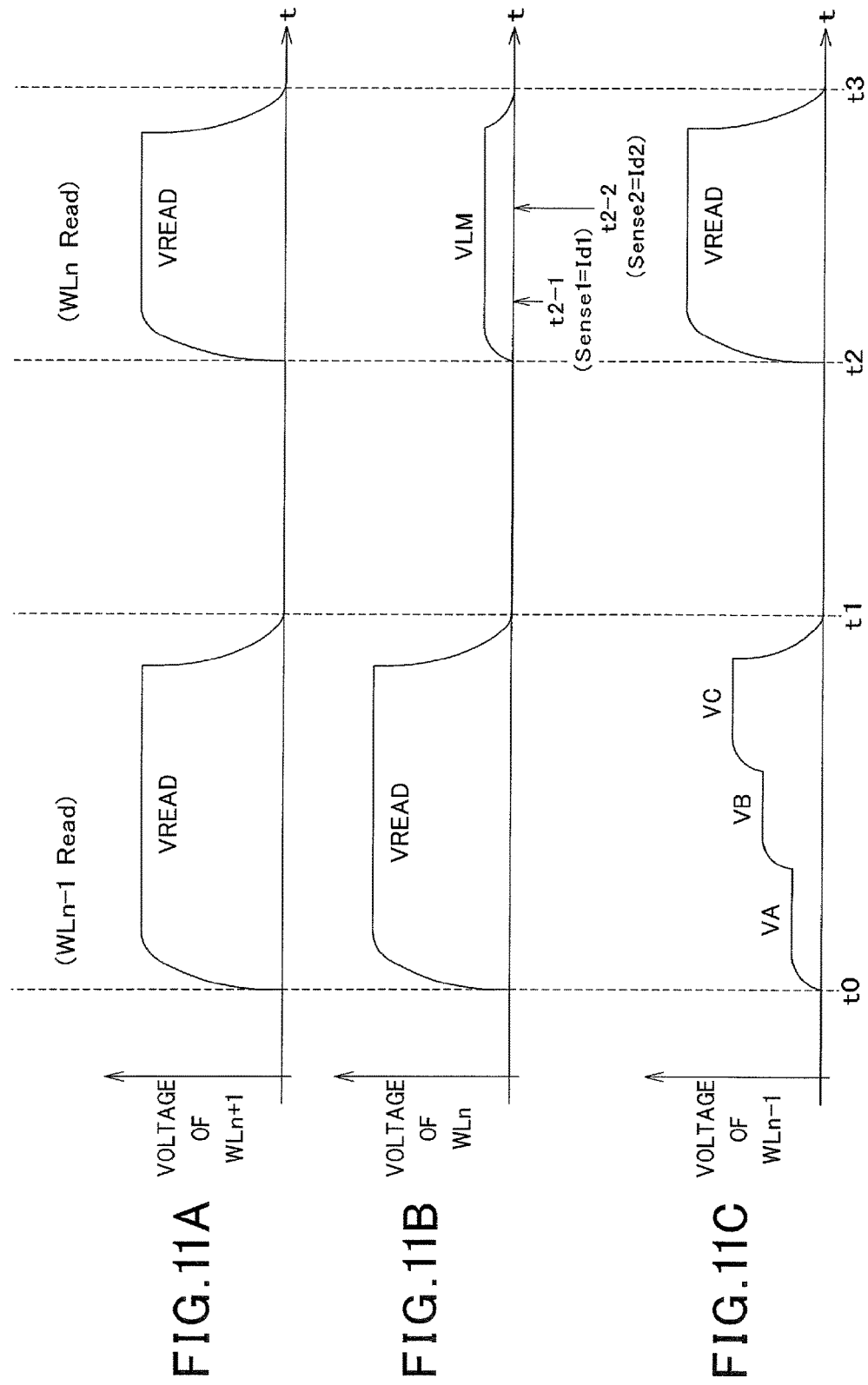
FIGS. 11A to 11C show timing charts of an IDL operation of a memory according to a fourth embodiment.

FIGS. 11A to 11C show timing charts of an IDL operation of a memory according to a fourth embodiment. In the fourth embodiment, data detection for the memory cells MCn+1 is not performed between times t1 and t2. That is, data of the memory cells MCn+1 is not detected.

Because the data of the memory cells MCn+1 is not detected, the adjacent interference effect caused by WRITE (E-LM) to the lower pages of the memory cells MCn+1 among the adjacent interference effects affecting the lower pages of the memory cells MCn (the adjacent interference effects caused by WRITE(E-A), WRITE(LM-C), and WRITE(E-LM)) is not considered. That is, the sequence control circuit 7 selects one of the detection results of the memory cells MCn without considering the adjacent interference effect caused by WRITE(E-LM).

Because the adjacent interference effect caused by write to the upper pages of the memory cells MCn+1 is not considered in the fourth embodiment as described above, two detection operations at times t2-1 and t2-2 suffice as the detection operation between the time t2 and a time t3. By performing two detection operations, a read time in a verify operation can be shortened. Other operations of the fourth embodiment can be basically identical to corresponding operations of the first embodiment.

In the fourth embodiment, the sequence control circuit 7 can select one of the detection results for the memory cells MCn considering the adjacent interference effects caused by WRITE(E-A) and WRITE(LM-C) to the memory cells MCn−1. Therefore, the memory according to the fourth embodiment can accurately detect data in the IDL to some extent even when the threshold distributions of the memory cells MCn overlap due to the adjacent interference effect.

The third and fourth embodiments and the first and second modifications described above can be combined with each other.

The configuration of the memory cell array 1 is described, for example, in U.S. patent application Ser. No. 12/407,403 filed on Mar. 19, 2009 and named "Three-dimensional stacked nonvolatile semiconductor memory". The configuration is also described in U.S. patent application Ser. No. 12/406,524 filed on Mar. 18, 2009 and named "Three-dimensional stacked nonvolatile semiconductor memory", U.S. patent application Ser. No. 12/679,991 filed on Mar. 25, 2010 and named "Nonvolatile semiconductor storage device and manufacturing method thereof", and U.S. patent application Ser. No. 12/532,030 filed on Mar. 23, 2009 and named "Semiconductor memory and manufacturing method thereof". The above patent applications are incorporated by reference herein in their entirety.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a memory cell array comprising a plurality of memory cells;
a plurality of word lines connected to the memory cells;
a plurality of bit lines connected to one end of current paths of the memory cells;
a sense amplifier part repeating a detection operation plural times when detecting data of ones of the memory cells connected to a word line WLn (n is an integer) among the word lines; and
a controller selecting one of a plurality of detection results obtained by the detection operations, based on data of memory cells connected to a word line WLn−1 and data of memory cells connected to a word line WLn+1.

2. The device of claim 1, wherein
the memory cells are capable of storing multibit data including a lower page and an upper page, respectively,
the sense amplifier part detects the lower pages of the memory cells connected to the word line WLn after data is written to the lower pages of the memory cells connected to the word line WLn and before data is written to the upper pages of the memory cells, and
the sense amplifier part repeats a detection operation plural times when detecting data of the lower pages.

3. The device of claim 2, wherein a voltage of the word line WLn is set to be constant when the lower pages of the memory cells connected to the word line WLn are to be detected.

4. The device of claim 2, wherein a voltage of the word line WLn is changed to voltages corresponding to the detection operations, respectively, when the lower pages of the memory cells connected to the word line WLn are to be detected.

5. The device of claim 2, wherein a voltage of the word line WLn+1 or WLn−1 is set to voltages corresponding to the detection operations, respectively, when the lower pages of the memory cells connected to the word line WLn are to be detected.

6. A semiconductor storage device comprising:
a memory cell array comprising a plurality of memory cells;
a plurality of word lines connected to the memory cells;
a plurality of bit lines connected to one end of current paths of the memory cells;
a sense amplifier part repeating a detection operation plural times when detecting data of ones of the memory cells connected to a word line WLn (n is an integer) among the word lines; and
a controller selecting one of the detection results obtained by the detection operations, based on data of ones of the memory cells connected to the word line WLn−1 or WLn+1 adjacent to the word line WLn on one side.

7. The device of claim 6, wherein
the memory cells are capable of storing multibit data including a lower page and an upper page, respectively,
the sense amplifier part detects the lower pages of the memory cells connected to the word line WLn after data is written to the lower pages of the memory cells connected to the word line WLn and before data is written to the upper pages of the memory cells, and
the sense amplifier part repeats a detection operation plural times when detecting data of the lower pages.

8. A semiconductor storage device comprising:
a memory cell array comprising a plurality of memory cells capable of storing plural-bit data including a lower page and an upper page;
a plurality of word lines connected to the memory cells;
a plurality of bit lines connected to one end of current paths of the memory cells;
a sense amplifier part detecting the lower pages of ones of the memory cells connected to a word line WLn (n is an integer) among the word lines after data is written to the lower pages of the memory cells connected to the word line WLn and before data is written to the upper pages of the memory cells; and a controller correcting detection results of the lower pages based on data of ones of the memory cells connected to word lines WLn−1 and WLn+1 adjacent to the word line WLn.

9. The device of claim 8, wherein the sense amplifier part repeats a detection operation plural times when detecting data of ones of the memory cells connected to the word line WLn among the word lines, and the controller selects one of a plurality of detection results obtained by the detection operations, based on data of ones of the memory cells connected to the word lines WLn−1 and WLn+1.

10. The device of claim 8, wherein the memory cells are capable of storing multibit data including a lower page and an upper page, respectively, after data is written to the lower pages of the memory cells connected to the word line WLn and before data is written to the upper pages of the memory cells, the sense amplifier part detects the lower pages of the memory cells connected to the word line WLn, and the sense amplifier part repeats a detection operation plural times when detecting the lower pages.

11. The device of claim 9, wherein the memory cells are capable of storing multibit data including a lower page and an upper page, respectively, the sense amplifier part detects the lower pages of the memory cells connected to the word line WLn after data is written to the lower pages of the memory cells connected to the word line WLn and before data is written to the upper pages of the memory cells, and the sense amplifier part repeats a detection operation plural times when detecting data of the lower pages.

* * * * *